United States Patent [19]

Hotta et al.

[11] 4,381,495
[45] Apr. 26, 1983

[54] DIGITAL-TO-ANALOG CONVERTER WITH ERROR COMPENSATION

[75] Inventors: Masao Hotta, Hachiouji; Kenji Maio, Tokyo; Norio Yokozawa, Fuchu; Hiromi Nagaishi, Hachiouji, all of Japan

[73] Assignee: Hitachi, Ltd., Tokyo, Japan

[21] Appl. No.: 195,137

[22] Filed: Oct. 8, 1980

[30] Foreign Application Priority Data

Oct. 24, 1979 [JP] Japan ............................... 54/136412

[51] Int. Cl.³ ........................................... H03K 13/02
[52] U.S. Cl. ....................... 340/347 DA; 340/347 CC; 340/347 M
[58] Field of Search ..... 340/347 M, 347 DA, 347 CC

[56] References Cited

U.S. PATENT DOCUMENTS

4,070,665  1/1978  Glennon et al. .............. 340/347 SY
4,316,178  2/1982  Shibayama et al. .......... 340/347 DA

OTHER PUBLICATIONS

Kennedy, Calibration of Analog Channels, IBM Technical Disclosure Bulletin, vol. 16, No. 9, 2/74, p. 2771.

Primary Examiner—T. J. Sloyan
Attorney, Agent, or Firm—Kenyon & Kenyon

[57] ABSTRACT

A digital-to-analog conversion system includes a digital-to-analog converter, a source of at least one set of digital input signals and a signal for error compensation and a digital signal for error detection to the converter, a switch to selectively couple either the one set of digital input signals and the signal for error compensation or the signal for error detection to the converter, a clock to generate a switching signal having a predetermined period and duration which is coupled to control the switch, a distribution switch for selectively coupling the output of the digital-to-analog converter to two different terminals, receiving a control input from the clock, a sample and hold circuit to sample and hold the output of the digital-to-analog converter, a detector for detecting a linearity error in the digital-to-analog converter output signal when the digital signal for error detection is coupled as an input thereto, a memory for storing the output of the detector, a circuit to write the output of the detector into the memory, and a circuit to read the data from said memory and couple it as the signal for error compensation at the input to the digital-to-analog converter.

6 Claims, 7 Drawing Figures

DIGITAL-TO-ANALOG CONVERTER WITH ERROR COMPENSATION

BACKGROUND OF THE INVENTION

1. Field of the Invention

This invention relates to a digital-to-analog converter (hereinafter, termed "DAC") for use in PCM recording/playing apparatuses for video disks, video tapes etc., and more particularly to the circuit arrangement of a DAC with a compensating circuit which is suitable for fabrication in the form of an integrated circuit (IC).

2. Description of the Prior Art

Heretofore, there has been known a method wherein the nonlinear characteristics of a DAC are compensated for by employing a ramp voltage of good linearity as a linearity reference. In the method, the compensation is executed on the upper bits of a digital input having large linearity errors, and it is completed by storing compensation magnitudes for respective addresses into a RAM (Random Access Memory) while using the upper bits as the addresses. In case of operating the DAC for digital-to-analog conversion (DAC), the compensation magnitude is read out and is added to an input data in a digital or analog fashion. The method will be explained more concretely.

①Case of Compensating Operation; A case of compensating for 4 upper bits of a digital input will be taken as an example.

A group of upper bits UB of a digital input and an output (initial value: "0000") of a first counter consisting of, for example, 4 bits are selected by a selecting circuit. At this time, a group of lower bits LB of the digital input are all made 0 (zero), and an output of a RAM or a group of compensation bits (consisting of m bits) is inhibited from entering. An input of the DAC consisting of the output of the selecting circuit and the lower bits LB is $I_o$ = "0000, 0 . . . 0," and an output of the DAC corresponding thereto includes only an offset component ($e_o$ volts). At the time when an output ($V_R$ volts) of a ramp voltage generator has exceeded $e_o$ volts, the counting of output clock pulses of a clock generator is started by a second counter (consisting of m bits). Simultaneously, an output (initial value: "0 . . . 0") of the second counter at this time is written into address "0000" of the RAM as a compensation magnitude for the input $I_o$ of the DAC, and the first counter counts up 1 (one) to make its output "0001."

Accordingly, the input of the DAC becomes $I_1$ = "0001, 0 . . . 0." Letting $e_1$ volts be the output of the DAC corresponding thereto, an output of the second counter at the time when the ramp voltage $V_R$ has exceeded $e_1$ volts is written into address "0001" of the RAM as a compensation magnitude for the input $I_1$ of the DAC, and the first counter counts up 1 (one) to make its output "0010."

Thereafter, compensation magnitudes for inputs ($I_2$–$I_{15}$) of the DAC corresponding to outputs "0010"–"1111" of the first counter are similarly written into addresses "0010"–"1111" of the RAM, whereupon the compensating operations are completed.

②Case of DAC Operation; The group of upper bits UB of the digital input are selected by the selecting circuit, they are applied to the DAC together with the group of lower bits LB and the output of the RAM corresponding to the upper bits UB, and a compensated analog output is provided.

According to the method described above in detail, one compensating operation requires a period of time of several tens of ms—several hundred ms, during which the DAC operation cannot be made. This brings about the problem that the DAC cannot be continuously used in such a case where the compensations need to be frequently made due to, for example, great temperature changes.

SUMMARY OF THE INVENTION

An object of this invention is to solve the problem in the prior-art DAC which is equipped with a circuit for calculating the compensation magnitude by the use of the ramp voltage generator, and to provide a novel DAC which can deliver a compensated analog signal by executing a DAC operation without taking a compensating time interval apparently.

In order to accomplish the object, according to this invention, a partial time interval in a fundamental period in which a DAC operation is executed is allotted to a compensating operation, so that not only the DAC operation but also the compensating operation is carried out in the fundamental period. More concretely, a distributing circuit which is constructed of switching means for distributing a DAC output to a predetermined circuit, and a sample and hold circuit which samples and holds the DAC output distributed by the distributing circuit during at least a time interval of the DAC operation are added to the prior art circuit. A signal corresponding to the DAC output distributed by the distributing circuit, and an output from the ramp voltage generator are compared in the time interval of the compensating operation. Thereafter, processes similar to the above the repeated to find desired compensation magnitudes and to write them into the RAM in succession.

DESCRIPTION OF THE PREFERRED EMBODIMENTS

Figure 1:
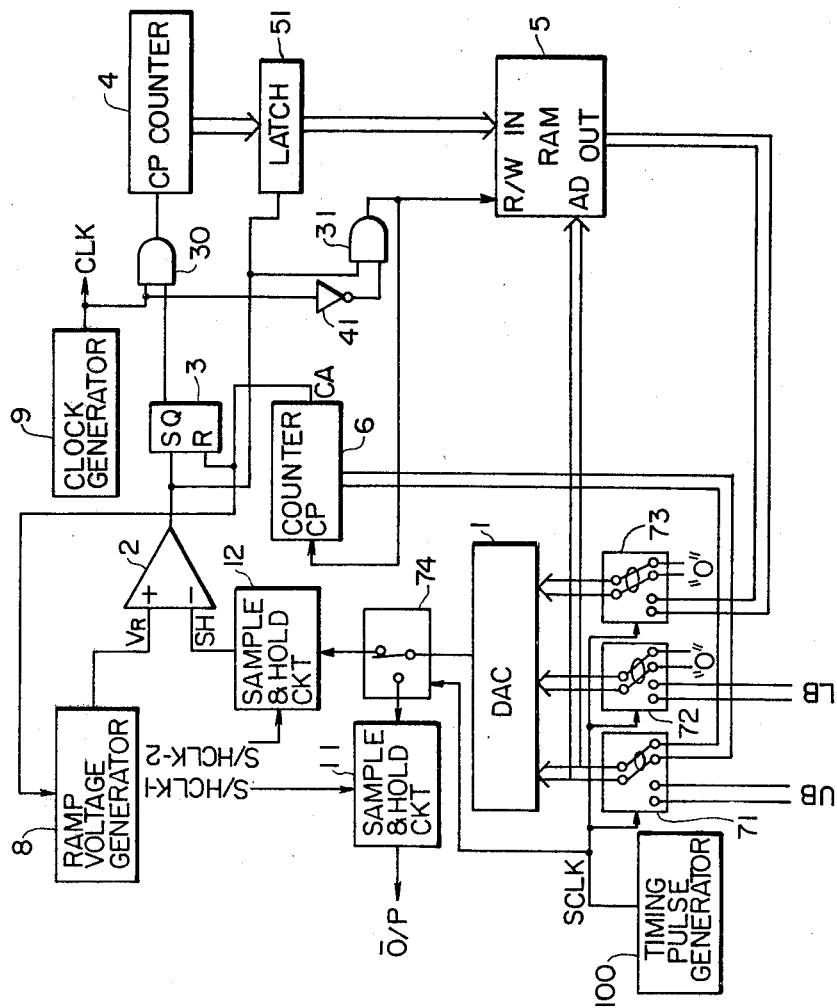
FIG. 1 is a diagram showing the circuit arrangement of a first embodiment of this invention.
Figure 2:
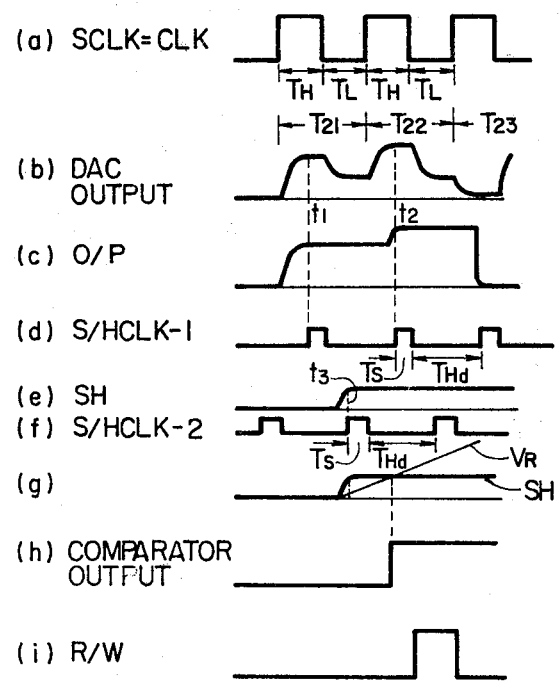
FIG. 2 is a diagram showing signal waveforms in principal parts of FIG. 1.

FIG. 1 shows a first embodiment of this invention. Numerals 71, 72 and 73 in FIG. 1 designate selecting circuits each of which includes a change-over switch circuit for selecting oen of two sets of input signals thereof. Numeral 74 designates a distributing circuit which includes a change-over switch circuit for distributing the input signals to one of two sets of output lines. The change-over switch circuits in these circuits are driven by timing pulses SCLK which are produced by a timing pulse generator 100 for generating predetermined timing pulses (in the present embodiment, the timing pulses SCLK are signals of the same timing as that of output clock pulses CLK of a clock generator 9). FIG. 2 is a time chart of principal signals in the first embodiment. The period T of the signal SCLK shown in FIG. 2, (a) corresponds to the fundamental period for performing the DAC operation. In the present embodiment, the DAC operation is carried out in that time interval $T_H$ of the fundamental period in which the signal SCLK is of logic "1," while the compensating operation is carried out in a time interval $T_L$ in which the signal SCLK is of logic "0." It is of course permissible to carry out the DAC operation in the time interval $T_L$ and the compensating operation in the time interval $T_H$.

Referring to FIGS. 1 and 2, in the time interval $T_H$ of the DAC operation in the first fundamental period 21, a group of upper bits UB and a group of lower bits LB of a digital input signal to be subjected to the DA conversion are respectively selected by the selecting circuits 71 and 72, and an output of a RAM 5, that is, a compensation magnitude stored before is selected by the selecting circuit 73.

An analog signal (FIG. 2, (b)) obtained by the DA conversion in a DAC 1 is delivered onto the side of a sample and hold circuit 11 by the distributing circuit 74. It is sampled by a timing pulse S/HCLK-1 (FIG. 2, (d)) which has a width $T_S$ and a period $T = T_S + T_{HD}$ and which is produced by the timing pulse generator 100 at a predetermined time after settling ($t_1$, $t_2$ etc. in FIG. 2, (b)), whereupon it is held till the time of the rise of the timing pulse S/HCLK-1 in the next fundamental period 22. Then, it is externally delivered as a signal O/P (FIG. 2, (c)).

In the time interval $T_L$ of the compensating operation in the fundamental period 21, an output $V_R$ of a ramp voltage generator 8 begins to rise, an output (initial value: "0000") of a 4-bit counter 6 is selected by the selecting circuit 71, and a group of lower bits which are all "0" and a group of compensation bits among which $m$ ($m \geq 1$) bit or bits are "0" are respectively selected by the selecting circuits 72 and 73. An input of the DAC 1 becomes $I_o =$ "0000,0 . . . 0," and an output of the DAC 1 responsive to the input $I_o$ is delivered onto the side of a sample and hold circuit 12 by the distributing circuit 74. It is sampled by a timing pulse S/HCLK-2 (FIG. 2, (f)) which has a width $T_S$ and a period $T = T_S + T_{HD}$ and which is produced by the timing pulse generator 100 at a predetermined time after the settling ($t_3$ in FIG. 2, (e)), whereupon it is held till the time of the rise of the timing pulse S/HCLK-2 in the next fundamental period 22.

An output signal SH (FIG. 2, (e)) of the sample and hold ciruit 12 is applied to a comparator 2, and is compared with the ramp voltage $V_R$ (FIG. 2, (g)). In synchronism with an output (FIG. 2, (h)) of the comparator 2 at the time when the ramp voltage $V_R$ has exceeded the output signal SH, an output (initial value: "0 . . . 0") of an m-bit counter 4 is set in a latch 51.

Simultaneously therewith, the output of the comparator 2 sets a set-reset type flip-flop 3, the output Q of which enables a gate 30. Accordingly, the output clock pulses CLK of the clock generator 9 are applied to a clock pulse (hereinbelow, abbreviated to "CP") terminal of the counter 4, and the counting of the pulses CLK is started.

On the other hand, since a gate 31 is enabled by the output of the comparator 2, the pulse CLK as inverted by an inverter 41, more specifically, a pulse corresponding to the first time interval of the compensating operation after the output of the comparator 2 has become logic "1" (in FIG. 2, (a), this time interval is the time interval $T_L$ in the fundamental period 22 subsequent to the fundamental period 21) becomes a signal R/W (FIG. 2, (i)) for assigning read/write of the RAM 5 so as to write the content of the latch 51 into address "0000" of the RAM 5. The address of the RAM 5 is afforded in such a way that the output (initial value: "0000") of the 4-bit counter 6 is selected by the selecting circuit 71.

The output pulse of the gate 31 is also applied to a CP terminal of the counter 6, so that the counter 6 counts up "1" to render its output "0001." In the time interval of the compensating operation in the fundamental period 23 subsequent to the fundamental period 22 in FIG. 2, (a), accordingly, the input of the DAC 1 becomes $I_1 =$ "0001,0 . . . 0," and the output of the DAC 1 responsive to the input $I_1$ is sampled and held by the sample and hold circuit 12 and compared with the ramp voltage $V_R$ in the comparator 2. In synchronism with the output of the comparator 2 at the time when the ramp voltage $V_R$ has exceeded the sampled and held value, the content of the counter 4 is set in the latch 51. The content of the latch 51 is written into address "0001" of the RAM 5 by a pulse corresponding to the succeeding first time interval of the compensating operation. The counter 6 counts up "1" more, and its output becomes "0010".

Thereafter, the above operations are similarly repeated in the time intervals of the compensating operations in the respective fundamental periods until the output of the counter 6 becomes "1111," upon which the compensation is completed. At the completion of the compensation, the outputs of the counter 4 and the counter 6 are restored to the initial states "0 . . . 0" and "0000," and the flip-flop 3 is reset and the ramp voltage $V_r$ is also restored to "0" by a carry signal CA of the counter 6. By causing $V_R$ to rise again, a new compensating operation can be executed.

The latch 51 in FIG. 1 is disposed in order to hold the content of the counter 4 till the time interval of the compensating operation because the content of the RAM 5 cannot be rewritten in the time interval of the DAC operation in each fundamental period. When the counter 4 is adapted to count up at the rise of the clock pulse CLK, the latch 51 is unnecessary.

Figure 4:
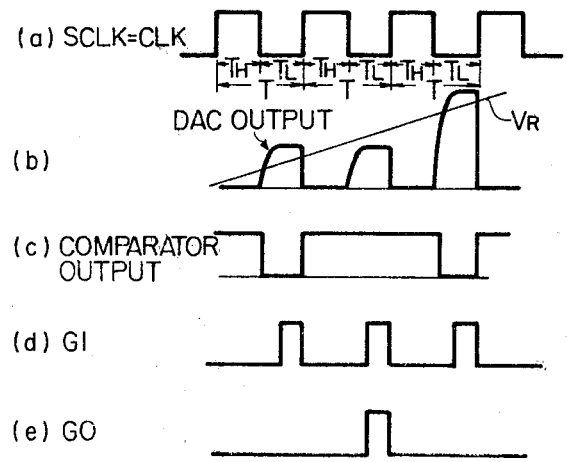
FIG. 4 is a diagram showing signal waveforms in principal parts of FIG. 3.
Figure 3:
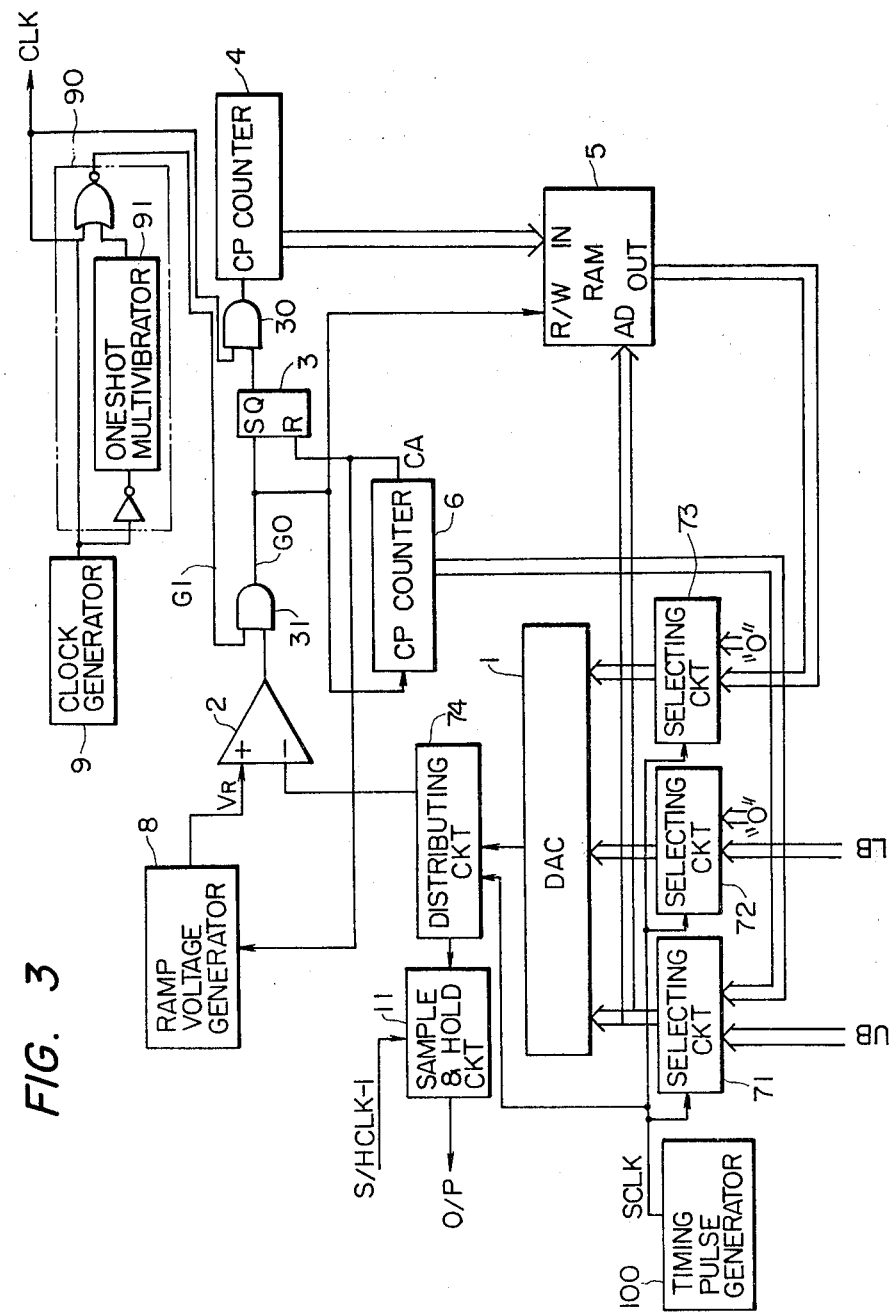
FIG. 3 is a diagram showing the circuit arrangement of a second embodiment of this invention.

Now, a second embodiment of this invention is shown in FIG. 3, and a time chart of principal signals in FIG. 3 is shown in FIG. 4. The second embodiment is an aspect of performance in the case where the sample and hold circuit 12 in the first embodiment shown in FIG. 1 is not employed. In FIG. 3, circuit portions which are assigned the same numerals as in FIG. 1 are the same as the circuit portions employed in FIG. 1.

In the period of time in which the timing pulse SCLK shown in FIG. 4, (a) is of logic "1," that is, in the time interval $T_H$ of the DAC operation in the fundamental period T, the operation of the second embodiment is the same as that of the first embodiment. In the time interval $T_L$ of the compensating operation, likewise to the case of the first embodiment, the output ("0000"–"1111") of the counter 6 is selected by the selecting circuit 71 and all 0's (zeros) are selected by the selecting circuits 72 and 73, and they are applied to the DAC 1. The output of the DAC 1 responsive thereto is delivered to the comparator 2 by the distributing circuit 74 without going through any sample and hold circuit, and it is compared with the ramp voltage $V_R$ as shown in FIG. 4, (b). In this case, unlike the first embodiment, the sample and hold circuit is not employed in the compensating time interval. Therefore, in both the time interval of the DAC operation and the compensating time interval, the output of the comparator 2 is indefinite until the output of the DAC 1 settles. Accordingly, the output (FIG. 4, (c)) of the comparator 2 in the compensating time interval and after the output of the DAC 1 has settled must be obtained. To this end, a gate 31 is employed, which is enabled by a gate input signal GI in FIG. 4, (d) at the settling only, so as to let the output of the comparator 2 pass therethrough. Thus, only when the ramp voltage has exceeded the output of the DAC 1, a gate output signal GO as shown in FIG. 4, (e) can be obtained. This signal is used to execute the count-up of the counter 6 and the writing of the content of the counter 4 into the RAM 5, whereby the compensation can be made similarly to the first embodiment. Here, the gate input signal GI for enabling the gate 31 during the settlement period of the DAC 1 is generated by a gate input signal generator 90. In the figure, an example employing a one-shot multivibrator 91 is shown.

As described above, in the first and second embodiments, the time interval of the DAC operation and the time interval for the compensation are set within one clock period, and hence, the effective settling time of the DAC becomes double that of the prior art. The period of the clock has its range determined from the settling time of the DAC 1 and the variation of the ramp voltage within one clock. Assuming by way of example that the settling time of the DA converter is 5 $\mu$sec, the period of the clock becomes 10 $\mu$sec. In case where the variation of the ramp voltage within one period of this clock is $\frac{1}{2}$ LSB and where the DAC is of 16 bits, the period of time which the ramp voltage requires for one compensation becomes $2^{16} \times 2 \times 10 \times 10^{-6} \approx 1.3$ sec. It is sufficiently possible to produce the ramp voltage of good linearity over such extent of period of time.

Figure 5:
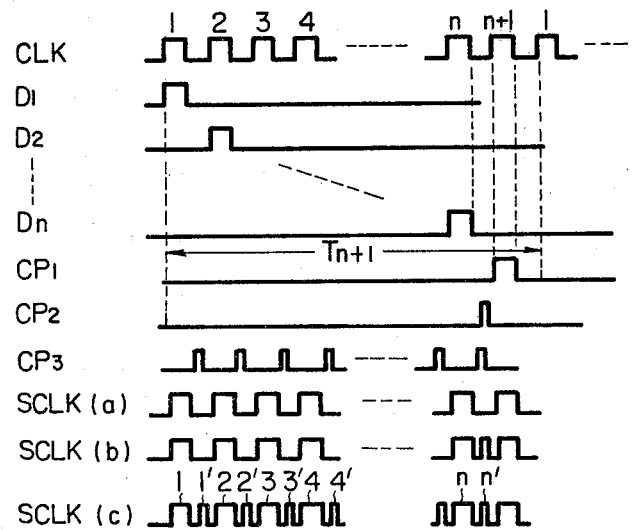
FIG. 5 is a diagram showing an example of allotment of compensating time intervals in the presence of a plurality of sets of input data.

In the above embodiments, there has been mentioned the example in which the time interval for performing the DAC operation and the time interval for making the compensation are alternately set for one digital input. However, in such a case where the DAC is used by switching n digital inputs, as illustrated in FIG. 5 n digital inputs $D_1, D_2, \ldots$ and $D_n$ are sequentially DA-converted in the respective logic "1" states of n clocks, the converted data are held during one period $T_{n+1}$ in which the n digital inputs are switched, and the compensation is made with a pulse $CP_1$ which corresponds to the logic "1" state of the $(n+1)$-th clock.

In this case, the period of time which the ramp voltage requires for one compensation under the aforecited conditions becomes approximately $1.3 \times (n+1)$ sec.

It is accordingly needed to realize a ramp voltage generator which has an excellent linearity over a period of time of at least approximately $1.3 \times (n+1)$ sec, or to shorten the settling time of the DAC in conformity with a period of time during which the linearity of the ramp voltage is ensured.

In order to carry out one compensation every $(n+1)$-th clock pulse, the following measure may be taken. The selecting circuit 71 in FIG. 1 or FIG. 3 is supplied with groups of upper bits $(UB_1, UB_2, \ldots$ and $UB_n)$ of the n digital inputs and the contents of the counter 6, and the selecting circuit 72 is supplied with groups of lower bits $(LB_1, LB_2, \ldots$ and $LB_n)$ of the digital inputs and a constant value (for example, "0"). On the output side of the distributing circuit 74 in FIG. 1 or FIG. 3, n sample and hold circuits 11 are prepared in correspondence with the respective digital inputs. The change-over switch of the selecting circuit which assigns the input data of the DAC 1, and the change-over switch of the distributing circuit which supplies the outputs of the DAC 1 successively to the n sample and hold circuits 11 and one input side of the comparator 2 are sequentially switched by the output signal SCLK of the timing pulse generator 100.

The signal SCLK in this case is shown by SCLK(a) in FIG. 5. It is a signal of the same timing as that of the clock signal CLK, and is produced by the timing pulse generator 100.

In case of FIG. 3 where the sample and hold circuit 12 as in FIG. 1 is not employed for the compensating circuit, the pulse $CP_1$ in FIG. 5 may be used instead of one input signal GI of the AND gate 31 shown in FIG. 3.

It is also possible to carry out the compensation at the logic "0" level of the n-th clock and to carry out it every n-th clock pulse. In this case, using a pulse $CP_2$ in FIG. 5 which is generated in the logic "0" level interval of the n-th clock pulse and which has a pulse width shorter than the logic "0" level interval of the clock pulse, the contents of the counter 6 and a predetermined constant may be selected as input data of the DAC 1 by the selecting circuits 71, 72 and 73, and the change-over switch of the distributing circuit 74 may be operated so as to render the output of the DAC 1 a signal corresponding to one input of the comparator 2. To this end, a signal SCLK(b) in FIG. 5 may be used as the switching signal SCLK. It is obtained in the form of $(CLK + CP_2)$. In case of FIG. 3, the signal GI may be replaced with the signal $CP_2$.

Further, it is possible to carry out the compensation at the logic "0" level of each of n clock pulses which switch n digital inputs in succession. In this case, using pulses $CP_3$ in FIG. 5 which are generated at the logic "0" levels of the respective clock pulses and which have a pulse width shorter than the logic "0" level interval of the clock pulse, the contents of the counter 6 and a predetermined constant may be selected as input data of the DAC 1 by the selecting circuits 71, 72 and 73, and the change-over switch of the distributing circuit 74 may be operated so as to render the output of the DAC 1 one input of the comparator 2. To this end, a signal SCLK(c) in FIG. 5 may be used as the switching signal SCLK. It is obtained in the form of $(CLK + CP_3)$.

It is also possible to use only the signal CLK in lieu of the signal (SCLK(c). In this case, the following measure may be taken. n input data of the DAC 1 and n sample and hold circuits for storing outputs of the DAC 1 corresponding thereto are assigned by sequentially switching them at the logic "1" levels of the respective clock pulses CLK. The contents of the counter 6 and a predetermined constant are selected as input data of the DAC 1 at the logic "0" levels of the respective clock pulses CLK. The change-over switch of the distributing circuit 74 is operated so that the output of the DAC 1 corresponding to the input data may become a signal corresponding to one input of the comparator 2.

In case of FIG. 3, the output of the gate input signal generator 90 corresponds to the signal $CP_3$ and is therefore used as it is.

All the signals $CP_1$–$CP_3$ are produced by the timing pulse generator 100.

Figure 7:
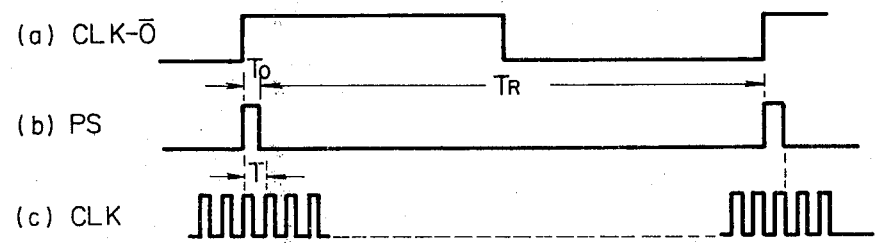
FIG. 7 is a diagram showing signal waveforms in principal parts of FIG. 6.
Figure 6:
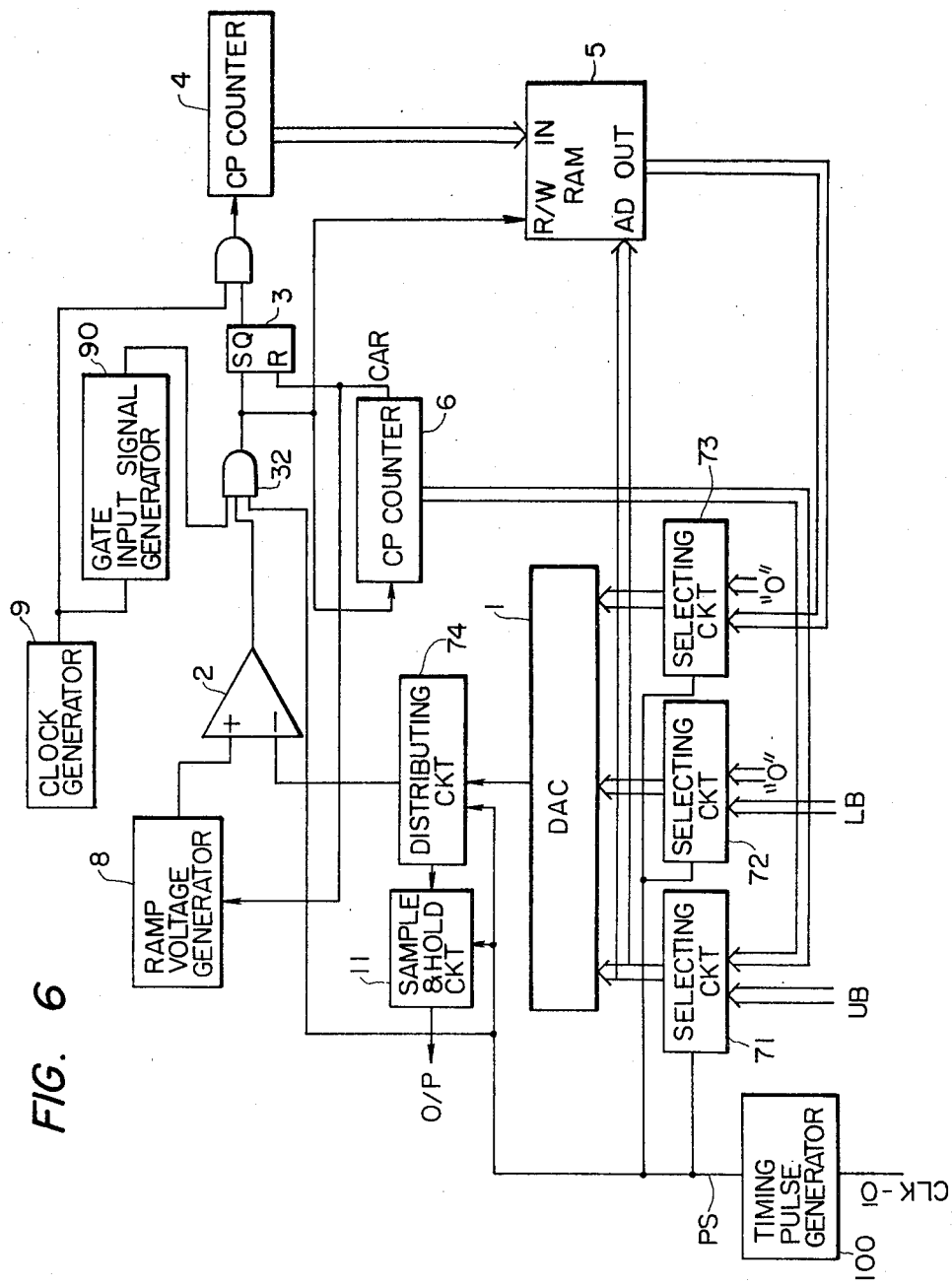
FIG. 6 is a diagram showing the circuit arrangement of a third embodiment of this invention.

In the above two embodiments, there has been illustrated the case where the clock for the DAC operation and the clock for the compensation are perfectly synchronous. However, they may well be asynchronous in the case where a converting time required for the DAC is sufficiently longer than the settling time of the DAC. Such an embodiment is shown in FIG. 6, and the corresponding time chart is shown in FIG. 7. Usually, the DAC in the compensation mode, pulses (FIG. 7, (c)) which are the same as the clock CLK generated by the clock generator 9 are produced in the timing pulse generator 100, and compensations are successively made at the logic "0" levels of the signal CLK. When a clock CLK-0 (FIG. 7, (a)) for establishing the DAC mode is applied from an external system to the timing pulse generator 100, a pulse PS (FIG. 7, (b)) which is synchronous with the clock CLK-0 and whose width is approximately equal to the settling time of the DAC is generated as a signal for setting a time interval for the DAC operation, by means of the timing pulse generator 100. Using this pulse PS, a digital input and the output of the RAM 5 are selected as input data of the DAC 1 by the selecting circuits 71, 72 and 73, the output of the DAC 1 is delivered onto the side of the sample and hold circuit 11 by the distributing circuit 74, and this output is externally provided as a signal O/P from the sample and hold circuit 11. During the time interval $T_O$ during which the pulse PS is of logic "1," the DAC effects the DAC operation, whereas during the other time interval $T_R$, the DAC output is held by the sample and hold circuit 11. The time interval $T_O$ for the DAC operation is made shorter than one period T of the internal clock CLK ($T_O \leq T$), the DAC operation is conducted in a part of the duration of the logic "1" state of the clock CLK, and the compensation is also conducted under the logic "0" state in the particular period, whereby the circuitry can be continuously used as the DAC without affording any error to the compensation. In this embodiment, the compensating circuit system may well be equipped with the sample and hold circuit 12 as in FIG. 1, and the operation in that case is similar to that of the first embodiment.

The technique according to this invention is of course applicable to a method wherein in the compensation mode, an analog signal obtained by DA-converting a digital input signal is returned into a digital signal again by an analog-to-digital converter of high precision, the difference between this digital signal and the initial digital input signal is evaluated, and the difference obtained is stored in a memory device as the error of an ADC, and subsequently, in the DA conversion mode, a digital input signal or an analog signal obtained by DA-converting this digital input signal has added thereto the digital error amount stored in the memory device or an analog signal obtained by DA-converting this digital error amount, respectively, whereby the error attendant upon the DA conversion is compensated for.

As set forth above, according to this invention, the time intervals for executing the DAC operations and the time intervals for making the compensations are alternately set, whereby the compensating time intervals can be apparently not present, i.e., one does not need to set aside a separate compensating time. The practical value of the invention is very great.

We claim:
1. A digital-to-analog conversion system comprising:
 (a) a digital-to-analog converter;
 (b) means for selectively supplying to said analog digital converter:
  (i) at least one set of digital input signals and a signal for error compensation; and
  (ii) a digital signal for error detection;
 (c) means to selectively couple either said one set of digital input signals and said signal for error compensation or said signal for error detection to said converter;
 (d) means to generate a switching signal having a predetermined period and duration, said switching signal coupled to control said means to selectively couple to thereby cause it to alternately couple said one set of digital input signals and said signal for error compensation and said signal for error detection to said converter;
 (e) distribution means for selectively coupling the output of said digital-to-analog converter to two different terminals, said means receiving a control input from said means to generate;
 (f) means coupled to one of said terminals to sample and hold the output of said digital-to-analog converter;
 (g) means for detecting a linearity error in said digital-to-analog converter output signal when said digital signal for error detection is coupled as an input thereto, coupled to the other terminal of said means to couple the input;
 (h) a memory for storing the output of said means for detecting an error;
 (i) means to write the output of said means for detecting into said memory; and
 (j) means to read the data from said memory and couple it as the signal for error compensation at the input to said digital-to-analog converter.

2. A digital-to-analog conversion system as defined in claim 1 wherein said means for detecting an error includes a further means to sample and hold the output at said other terminal.

3. A digital-to-analog conversion system as defined in claim 1 wherein said means for generating comprises means to generate clock pulses, said clock pulses being used as said switching signal.

4. A digital-to-analog converter as defined in claim 1 wherein said means to generate comprise means to generate clock pulses and means to generate a switching signal, said means to generate said switching signal receiving said clock pulses as inputs and adapt it to provide a switching signal output in response to a predetermined number of transitions of said clock pulses, said predetermined number being at least one.

5. A digital-to-analog conversion system as defined in claim 1 or 2 wherein said means for detecting an error includes:
 (a) a ramp generator;
 (b) means to compare the output of said ramp generator with the signal at said other terminal;
 (c) a first counter coupled to count output pulses from said means to compare;
 (d) a clock; and
 (e) a second counter for counting clock pulses, the output of said second counter being coupled as the input to said memory in response to an output from said comparison means.

6. A digital-to-analog conversion system according to claim 5 wherein said means for selectively supplying includes means to supply the count stored in said first counter and a predetermined digital value as said digital signal for error detection.

* * * * *